United States Patent
Patil et al.

(10) Patent No.: US 9,570,572 B2
(45) Date of Patent: Feb. 14, 2017

(54) MULTIPLE LAYER INTERFACE FORMATION FOR SEMICONDUCTOR STRUCTURE

(71) Applicant: GLOBALFOUNDRIES Inc., Grand Cayman (KY)

(72) Inventors: Suraj K. Patil, Ballston Lake, NY (US); Min-hwa Chi, Malta, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/523,640

(22) Filed: Oct. 24, 2014

(65) Prior Publication Data

US 2016/0118468 A1    Apr. 28, 2016

(51) Int. Cl.
| | |
|---|---|
| *H01L 21/285* | (2006.01) |
| *H01L 29/45* | (2006.01) |
| *H01L 21/28* | (2006.01) |
| *H01L 21/324* | (2006.01) |
| *H01L 29/66* | (2006.01) |

(52) U.S. Cl.
CPC ......... *H01L 29/45* (2013.01); *H01L 21/28052* (2013.01); *H01L 21/28518* (2013.01); *H01L 21/28568* (2013.01); *H01L 21/324* (2013.01); *H01L 29/665* (2013.01)

(58) Field of Classification Search
None
See application file for complete search history.

(56) References Cited

U.S. PATENT DOCUMENTS

| | | | |
|---|---|---|---|
| 5,656,546 A | 8/1997 | Chen et al. | |
| 7,416,967 B2 * | 8/2008 | Tsuchiya | H01L 21/823835 257/E21.002 |
| 2003/0180994 A1 * | 9/2003 | Polishchuk | H01L 21/28079 438/199 |
| 2007/0210351 A1 * | 9/2007 | Tsuchiya | H01L 21/823835 257/288 |
| 2008/0113480 A1 * | 5/2008 | Nishida | H01L 21/823857 438/278 |
| 2012/0299007 A1 * | 11/2012 | Chung | H01L 27/1277 257/72 |
| 2015/0243565 A1 * | 8/2015 | Nieh | H01L 21/823871 257/369 |

OTHER PUBLICATIONS

J.S.Byun and H.J.Kim. "Layer sequence and silicide formation of a Co/(refractory metal) bilayer on (100)Si substrate", J. Appl. Phys. 78 (II), p. 6784, Dec. 1995.
Maryna Baldé, "Silicide Formation Through Diffusion Barriers", PhD Thesis, U. of Stellenbosch, 2005, 137 pages.

* cited by examiner

*Primary Examiner* — Abul Kalam
(74) *Attorney, Agent, or Firm* — Heslin Rothenberg Farley & Mesiti P.C.; Kristian E. Ziegler (57) ABSTRACT

There is set forth herein a method of fabricating a contact interface formation. A layer of Ti metal can be deposited on a substrate and a layer of Ni metal can be deposited over the layer of Ti metal. An annealing process can be performed to form a contact interface formation having Ti in reacted form and Ni in reacted form.

11 Claims, 5 Drawing Sheets

MULTIPLE LAYER INTERFACE FORMATION FOR SEMICONDUCTOR STRUCTURE

FIELD

There is set forth herein a semiconductor structure having an interface formation and more particularly a multiple layer interface formation.

BACKGROUND

Silicide processes have been widely used to form silicide formations for contacts on gate regions and source/drain (S/D) regions during the semiconductor device fabrication processing to improve the performance of the semiconductor device. The silicide formation improves the operational speed of the semiconductor device by reducing the contact resistance between the metal contact and the source and drain regions.

Silicide formation materials that have been employed with semiconductor structures include Al-silicide, Ni-silicide, Pt-silicide, Co-silicide, Cr-silicide, Ti-silicide, Ni1-xPtx-silicide, W-silicide, Mo-silicide, Ag-silicide, Au-silicide, Ta-silicide, and Er-silicide.

Some silicide formations have been observed to pose a risk of leakage or shorting of a silicided S/D junction. The diffusion characteristics of unreacted metal into underlying doped silicon (Si), silicon germanium (SiGe) and germanium (Ge) substrates can create problems such as piping/spiking defects during the silicidation process. Such problems can lead to leakage of current into the channel as well as the junction regions, resulting in degradation in device performance.

Some silicide formations have been observed to be sensitive to oxygen contamination from the ambient air, wet etch chemistries and from residual interfacial contaminants such as native oxides. Such contamination can lead to rough and/or insulating interfaces causing high contact resistance in the device.

BRIEF DESCRIPTION

There is set forth herein a contact interlace formation and method of fabricating a contact interface formation. A layer of Ti metal can be deposited on a substrate and a layer of Ni metal can be deposited over the layer of Ti metal. An annealing process can be performed to form as contact interface formation having Ti in reacted form and Ni in reacted form.

BRIEF DESCRIPTION OF THE SEVERAL VIEWS OF THE DRAWINGS

One or more aspects as set forth herein are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1A:
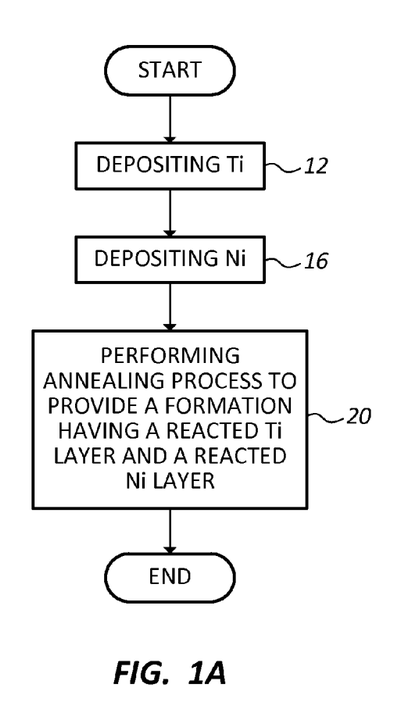
FIGS. 1A-1B are flow diagrams illustrating a method of silicide formation.

A method of forming an interface formation fir a field effect transistor (FET) is set forth in FIG. 1A. A method can include at block 12 depositing a layer of Ti metal and at block 16 depositing a layer of Ni metal. A method can further include at block 20 performing an annealing process to form an interface formation having a layer of Ti in reacted form and a layer of Ni in reacted form. In one embodiment an interface formation can be a contact interface formation that includes one or more silicide layer.

Figure 1B:
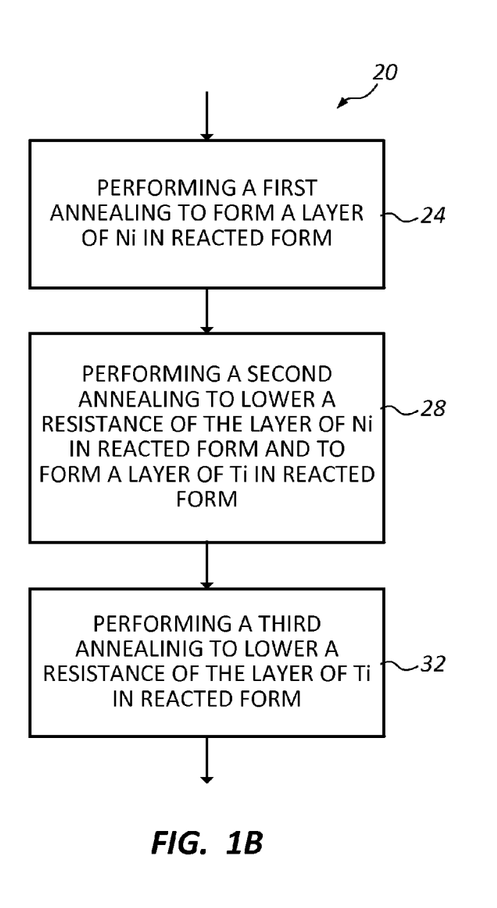

FIG. 1B illustrates an exemplary annealing process performed as part of block 20. In one embodiment, an annealing process (block 20, FIG. 1B) can include performing at block 24 a first annealing to form a layer of Ni in reacted form. An annealing process (block 20) can further include at block 28 performing a second annealing to lower a resistance of the layer of Ni in reacted form and to them a layer of Ti in reacted form. An annealing process (block 20) can further include at block 32 performing a third annealing to lower a resistance of a formed layer of Ti in reacted form. A third annealing (block 32) can further lower the resistance of an overall stack. A third annealing (block 32) can further result in interface repair between a silicide layer and an underneath layer, e.g. an underneath epitaxial growth layer where a semiconductor structure includes an epitaxial growth layer. In one embodiment, the annealing at block 24, the annealing at block 28, and the annealing at block 32 can be performed at different discrete temperatures. In one embodiment, one or more annealing at block 24, 28 and 32 can be deleted. In one embodiment, an annealing process including performing of annealing at different discrete temperatures can be substituted the by a process including performing a ramped temperature annealing.

Figure 2:
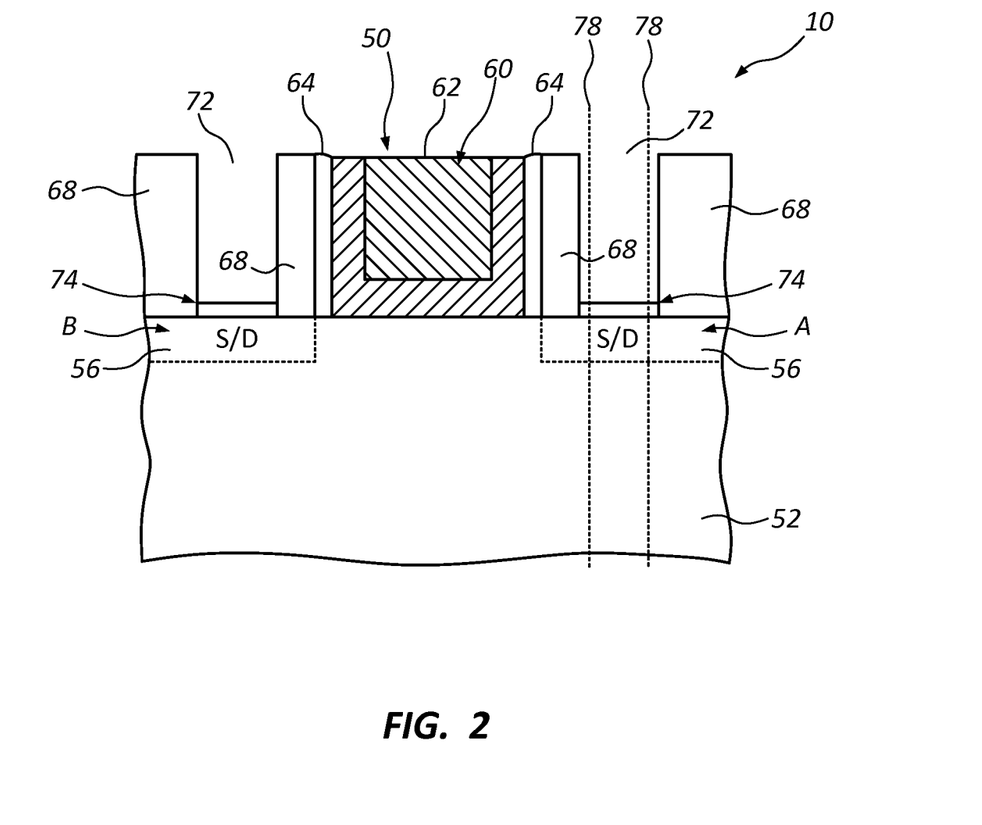
FIG. 2 is a cross sectional view of a semiconductor structure.

A semiconductor structure 10 formed according to as method as set forth herein is shown in FIG. 2. Semiconductor structure 10 can include one or a plurality of field effect transistors including first field effect transistor 50 (FET). FET 50 can include a gate 60 formed on a substrate and source/drain (S/D) regions 56 can be formed on substrate 52. In one embodiment, S/D regions 56 can be raised S/D regions including raised portions formed by epitaxial growth processes. Gate 60 can include gate material 62 (e.g. metallic or polysilicon gate material, high-K gate dielectrics, barrier films) and gate spacers 64.

Semiconductor structure 10 can also include an oxide layer 68. Within oxide layer 68 there can be formed contact holes 72 which can extend from a top elevation of oxide layer 68 to S/D regions 56. Formed according to a method herein, FET 50 can also include a contact interface formation 174. A contact interface formation 174 can be formed on an S/D region 56 of FET 50 at area 74 depicted in FIG. 2. A remainder of a contact (not shown) which can include a metal deposition can be formed above contact interface formation 174. In one embodiment, contact interface formation 174 can include multiple laces. In one embodiment, contact interface formation 174 can include multiple silicide layers. In one embodiment, contact interface formation 174 can include a silicide layer and a nitride layer.

Substrate 52 as shown in FIG. 2 can be, e.g., a fin extending from a bulk substrate of a semiconductor structure in accordance with a FinFET architecture, a nanowire extending from a bulk substrate of a semiconductor structure in accordance with a nanowire architecture, a substrate of a semiconductor structure in accordance with a planar architecture. Substrate 52, where included in a semiconductor structure in accordance with a planar semiconductor architecture can be, e.g., a bulk substrate, or a top thin layer of a thin layer planar semiconductor structure (e.g. a silicon-on-insulator or SOI architecture).

Specific examples of methods as set forth in FIGS. 1A and 1B are described with respect to FIGS. 3A-5D. In the views as shown in FIGS. 3A-5D section of the cross section of FIG. 2 is shown; namely, a section of semiconductor structure 10 showing a stack elevation through a section of S/D region 56 within arbitrary sectional planes 78 extending through contact holes 72 shown in FIG. 2.

Figure 3A:
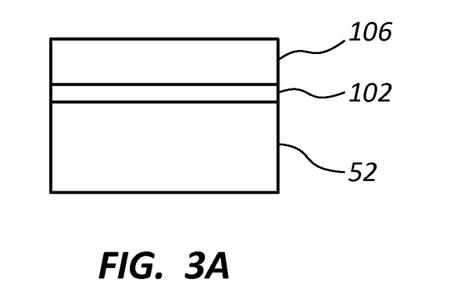
FIGS. 3A-3C illustrate semiconductor structures in various stages of fabrication.
Figure 3B:
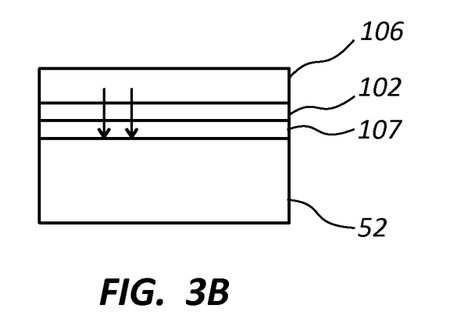
Figure 3C:
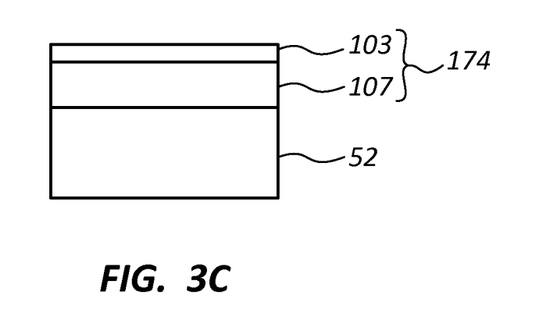

With reference to FIGS. 3A-3C, there is set forth herein a semiconductor structure 10 in various stages of fabrication and illustrating a silicide formation method. A method as illustrated in FIG. 3A-3C can include various stages.

Referring to FIG. 3A, a layer 102 of Ti metal can be deposited over a source/drain (S/D) region 56 of substrate 52. Substrate 52 can be an Si substrate. The layer 102 of Ti metal can be a thin layer and can have a thickness of from about 2 nm to about 5 nm in one example layer 102 can be deposited directly on substrate 52, or alternately on an oxide layer (not shown) previously grown on substrate 52. A layer 106 of Ni metal can then be deposited over layer 102. Layer 106 of Ni metal can be from about 5 nm to about 10 nm in one example. The depositing of layer 102 and layer 106 can be performed using, e.g., physical vapor deposition (PVD), metal organic chemical vapor deposition (MOCVD), or atomic layer deposition (ALD) methods. In one embodiment layer 102 and layer 106 can be deposited over a large area of semiconductor structure 10. Layer 102 and layer 106 can be deposited over a plurality of gates 60 and a plurality of S/D regions 56.

Referring to FIG. 3B, the structure of FIG. 3A can be subject to a first annealing (block 24). Annealing can include rapid thermal anneal (RTA) in one example. Referring to FIG. 3B, FIG. 3B depicts the structure of FIG. 3A after being subject to RTA at a temperature of about 250 C to about 300 C. The first annealing at block 24 can include annealing at a certain temperature within a temperature range of from about 250 C to about 300 C.

Referring to FIG. 3B a resulting structure resulting from performance of a first annealing can include layer 102 in Ti metal form and layer 106 in Ni metal form as depicted in FIG. 3A but can also include a reacted Ni layer 107 above substrate 52 and below layer 102 of Ti metal. Reacted Ni layer 107 can be Ni-silicide in one embodiment. In one particular embodiment, reacted Ni layer 107 can be Ni-silicide formed to the first phase $Ni_2Si$ by Ni atoms moving through layer 102 of Ti metal and into Si substrate 52. Layer 102 of Ti metal in the stage depicted in FIG. 3B can in one embodiment remain in unreacted metal form. During a first annealing (block 24) Ni atoms can move through 102 in Ti metal form and into substrate 52. For the formation of reacted Ni layer 107 during the first annealing (block 24), Ni can serve as a dominant diffusion species. Ni-silicide can be formed by Ni migrating into Si.

Referring to FIG. 3C, FIG. 3C illustrates the structure of FIG. 3B after being subject to a second annealing. A second annealing (block 28) can include performing RTA at from about 300 C to about 450 C (second annealing). The second annealing (block 28) can include annealing at a certain temperature within a temperature range of from about 300 C to 450 C (second annealing). The performing of RTA at from about 300 C to about 450 C (second annealing) can lower a resistance of reacted Ni layer 107. After the second annealing, reacted Ni layer 107 can be in the form of NiSi. In addition, the performing of RTA at from about 300 C to about 450 C (second annealing) can result in conversion of layer 102 of Ti metal into reacted Ti layer 103. Reacted Ti layer 103 can be Ti-silicide in one embodiment. Reacted Ti layer 103 in the stage depicted in FIG. 3C can be formed the in the form of TiSi (C45). For the formation of reacted Ti layer 103 during the second annealing (block 28), Si can serve as a dominant diffusion species. Ti-silicide can be formed by Si migrating into Ti.

An optional third annealing (block 32) can include performing RTA at from about 600 C to about 700 C (third annealing). The third annealing (block 32) can include performing RTA at a certain temperature within a temperature range of from about 600 C to about 700 C (third annealing). An optional third annealing can alternatively include performing laser spike annealing (LSA) at a certain temperature within a temperature range of from about 700 C to about 825 C for a short duration, e.g., less than 0.5 ms. With the performing of RTA at from about 600 C to 700 C (third annealing) a resistance of reacted Ti layer 103 can be lowered. A resistance of an overall stack can also be lowered by the third annealing. After a third annealing, reacted Ti layer 103 can be in the form of TiSi-C54 in one embodiment.

The method set forth in reference to FIGS. 3A-3C can result in a dual layer (Ti-silicide over Ni-silicide) silicide formation with reduced resistance and a uniformized Ni-silicide interface to substrate 52.

Figure 4A:
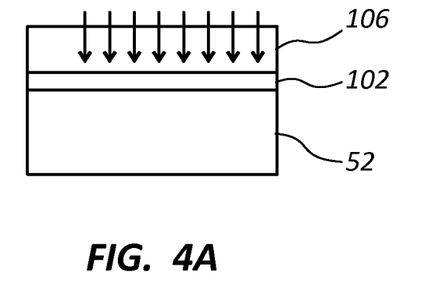
FIGS. 4A-4C illustrate semiconductor structures in various stages of fabrication.
Figure 4B:
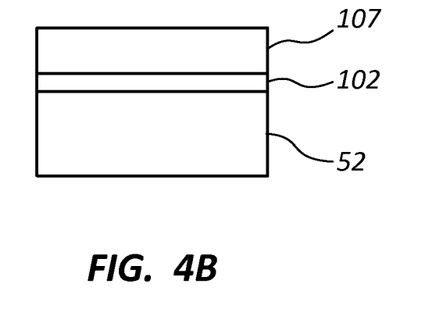
Figure 4C:
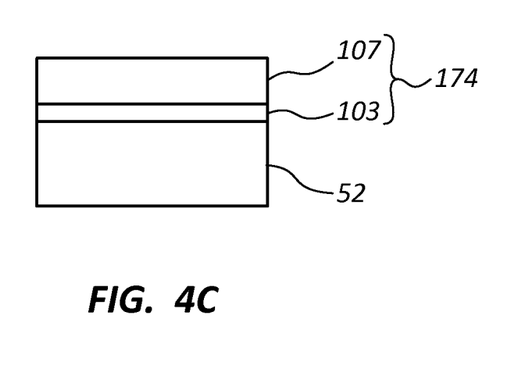

With reference to FIG. 4A-4C, there is set forth herein a semiconductor structure 10 in a partial state of fabrication and illustrating another silicide formation method, in accordance with a method generally described in FIGS. 1A and 1B.

Referring to FIG. 4A, a layer 102 of Ti metal can be deposited over a source/drain (S/D) region 56 of a substrate, e.g., substrate 52. Substrate 52 can be an Si substrate. The layer 102 of Ti metal can be a thin layer and can have a thickness of from about 2 nm to about 5 nm in one example. A layer 106 of Ni metal can then be deposited over layer 102. Layer 106 of Ni metal 106 can be from about 5 nm to about 10 nm in one example. The depositing of layer 102 and layer 106 can be performed using, e.g., physical vapor deposition (PVD), metal-organic chemical vapor deposition (MOCVD), or atomic layer deposition (ALD) methods. In one embodiment, layer 102 and layer 106 can be deposited over a large area of semiconductor structure 10. Layer 102 and layer 106 can be deposited over a plurality of gates 60 and a plurality of S/D regions 56.

After depositing of layer 102 and layer 106, the semiconductor structure 10 as shown in FIG. 4A can be subject to Si implantation as depicted by arrows 120. The implantation of Si can be performed in one embodiment with an energy level of from about 1 Kev to about 2 Kev and a dose of about 1E12 $cm^{-2}$ to about 1E15 $cm^{-2}$ so that Si atoms can be primarily located at an interface between layer 102 of Ti metal and layer 106 of Ni metal.

Referring to FIG. 4B, the structure of FIG. 4A can be subject to a first annealing (block 24). The first annealing can include rapid thermal anneal in one example. Referring to FIG. 4B, FIG. 4B depicts the structure of FIG. 4A after being subject to RTA at a temperature of about 250 C to about 300 C (first annealing). The first annealing can include annealing at a certain temperature within a temperature range of from about 250 C to about 300 C. Referring to FIG. 4B, a resulting structure resulting from a first annealing can include layer 102 of Ti metal as depicted in FIG. 4A but can also include reacted Ni layer 107 above Ti layer 102. By the injection of Si so that Si atoms are provided at the interface between layer 102 of Ti metal and layer 106 of Ni metal, a location of reacted Ni layer 107 can be controlled to be above layer 102 rather than below layer 102 and above substrate 52, as in the embodiment of FIGS. 3A-3C. Reacted Ni layer 107 can include Ni-silicide. Reacted Ni layer 107 in one embodiment can be Ni-silicide formed in a first phase ($Ni_2Si$). For the formation of reacted Ni layer 107 during the first annealing (block 24), Ni can serve as a dominant diffusion species. Ni-silicide can be formed by Ni migrating into Si.

Referring to FIG. 4C, FIG. 4C illustrates the structure of FIG. 4B after being subject to a second annealing. The second annealing can include an additional RTA process. A second annealing (block 28) can include performing RTA at from about 300 C to about 450 C. A second annealing (block 28) can include performing reactive thermal annealing at a certain temperature within a temperature range of from about 300 C to about 450 C. The performing of RTA at from about 300 C to about 450 C (second annealing) can reduce a resistance of reacted Ni layer 107. After a second annealing reacted Ni Layer 107 can be in the form of NiSi. In addition, performing of RTA at from about 300 C to about 450 C (second annealing) can result in conversion of layer 102 or Ti metal into reacted Ti metal layer 103. Reacted Ti metal layer 103 can include Ti-silicide. Reacted Ti layer 107 can be provided in the form of TiSi (C49). For the formation of reacted Ti layer 103 during the second annealing (block 28), Si can serve as a dominant diffusion species. Ti-silicide can be formed by Si migrating into Ti.

A third annealing (block 32) can include performing RTA at from about 600 C to about 700 C. A third annealing (block 32) can include performing RTA at a certain temperature within a temperature range of from about 600 C to about 700 C. A third annealing can alternatively be performed using LSA at a temperature ranging from about 700 C to about 825 C for a short time period, e.g., less than 0.5 ms. With the performing of a third annealing a resistance of reacted Ti layer 103 can be reduced. After a third annealing reacted Ti layer 103 can be in the low resistance form TiSi-C54. A resistance of an overall stack can also be lowered by the third annealing.

The method set forth in reference to FIGS. 4A-4C can result in a dual layer Ni-silicide over Ti-silicide contact interface formation. The contact interface formation can include a reduced resistance and a uniformized Ti-silicide interface.

Referring again to the flow diagram as set forth herein FIG. 1A, a method of forming a contact interface formation can include depositing at block 12 a layer of Ti, depositing at block 16 a layer of Ni, and at block 20 performing an annealing process. In another aspect as set forth in reference to FIG. 4A-4C a method herein can include selectively implanting silicon (Si) into a semiconductor structure 10. Such selective implantation of Si can reverse an order of silicide layers in an contact interface formation. Without implantation of Si, a formed contact interface formation can include Ti-silicide over Ni-silicide. With implantation of Si, a formed contact interface formation can include Ni-silicide over Ti-silicide.

A contact interface formation having first and second silicide layers can be provided using a method set forth in FIGS. 3A-3C and by the method set forth in reference to FIGS. 4A-4C. Using methods set forth herein, including selective implantation (doping) an interface formation can be n friendly (Ni-silicide over Ti-silicide) or p friendly (Ti-silicide over Ni-silicide). A contact interface formation having first and second silicide layers can feature increased thermal stability, an increased Schottky Barrier height, and reduced resistance as compared to a contact interface formation having a single silicide layer.

A method as set forth in reference to FIG. 1A can in one embodiment be accompanied by selective implantation of one or more of Si and Nitrogen (N). With selective implantation of Si and N, a formed contact interface formation can include Ni silicide over Ti in reacted form.

With reference to FIG. 5A-5D, there is set forth herein a semiconductor structure 10 in a partial state of fabrication and illustrating another contact interface formation method in accordance with the method generally described in reference to FIGS. 1A and 1B.

Figure 5A:
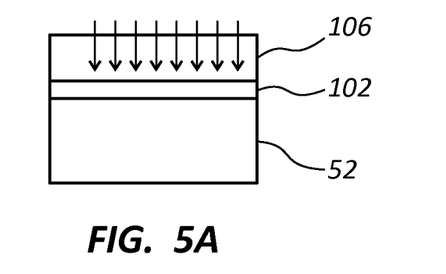
FIGS. 5A-5D illustrate semiconductor structures in various stages of fabrication.

Referring to FIG. 5A, a layer 102 of Ti metal can be deposited over a source/drain (S/D) region 56 of a substrate 52, e.g., an Si substrate. The layer 102 of Ti metal can be a thin layer and can have a thickness of from about 2 nm to about 5 nm in one example. A layer 106 of Ni metal can then be deposited over layer 102. Layer 106 of Ni metal 106 can be from about 5 nm to about 10 nm in one example. The depositing of layer 102 and layer 106 can be performed using, e.g., sputtering or atomic laser deposition (ALD) methods. In one embodiment, layer 102 and layer 106 can be deposited over a large area of semiconductor structure 10. Layer 102 and layer 106 be deposited over a plurality of gates 60 and a plurality of S/D regions 56.

Figure 5B:
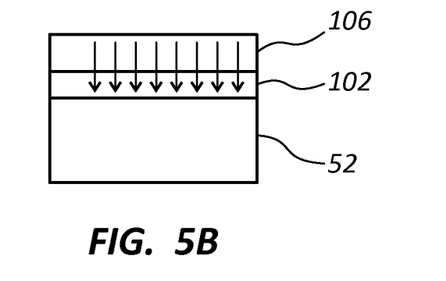

Referring to FIGS. 5A and 5B there is depicted first and second implantation processes. In FIG. 5A there depicted a Si implantation process that can be performed so that Si atoms are provided mainly at an interface between Ti layer 102 and Ni layer 106. As depicted in FIG. 5B, semiconductor structure 10 can also be subject to an N implantation process. According to an N implantation process, N can be implanted mainly at interface between substrate 52 and layer 102 of Ti metal.

Figure 5C:
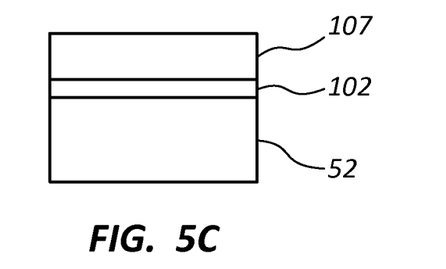

The structure as shown in FIG. 5B can be subject to a first annealing. The first annealing (block 24) can include reactive thermal annealing (RTA) in one example. Referring to FIG. 5C, FIG. 5C depicts the structure of FIG. 5B after being subject to RTA at a temperature of about 250 C to about 300 C (first annealing). The first annealing at block 24 can include reactive thermal annealing at a certain temperature within a temperature range of from about 250 C to about 300 C. Referring to FIG. 5C, a resulting structure can include layer 102 of Ti metal as depicted in FIG. 5B but can also include reacted Ni layer 107 above layer 102 of Ti metal which layer 102 can remain in unreacted metal form. Reacted Ni layer 107 can include an Ni-silicide. Referring to FIG. 5C, reacted Ni layer 107 can include Ni-silicide formed to the first phase $Ni_2Si$. For the formation of reacted Ni layer 107 during the first annealing (block 24), Ni can serve as a dominant diffusion species. Ni-silicide can be formed by Ni migrating into Si.

Figure 5D:
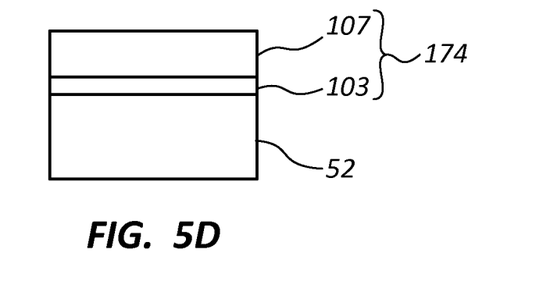

Referring to FIG. 5D, FIG. 5D illustrates the structure of FIG. 5C after being subject to a second annealing. A second annealing (block 28) can include performing RTA at from about 300 C to 450 C (second annealing). The second annealing can include performing RTA at a certain temperature within a temperature range of from about 300 C to about 450 C. The performing of RTA (second annealing) at from about 300 C to about 450 C can lower a resistance of reacted Ni layer 107. In addition, the performing of RTA at from about 300 C to 450 C (second annealing) can result in conversion of layer 102 of Ti metal into a reacted Ti layer 104. Reacted Ti layer 104 can include TiN. In one embodiment, an implantation of N as set forth herein, which can occur prior to a first annealing, can inhibit a formation of Ti silicide during a first annealing. An optional third annealing (block 32) can include performing RTA at from about 600 C to about 700 C (third annealing). With the performing of RTA (third annealing) at from about 600 C to 700 C a resistance of reacted TIN layer 104 can be lowered. A resistance of an overall stack, including TiN layer 104 and Ni layer 107 in reacted form, can also be lowered by the third annealing. An optional third annealing can alternatively be performed by application of LSA for a short time period, e.g., less than 0.5 ms.

The method set forth in reference to FIGS. 5A-5D results in a dual layer (Ni-Silicide over TiN) contact interface formation with reduced resistance and a uniformized TiN interface to Si. The method of FIGS. 5A-5D can also reduce a Schottky barrier energy level. The method of FIGS. 5A-5D provides for formation of a TiN layer without deposition of TiN. The contact interface formation set forth in FIG. 5D defines a metal insulator silicon (MIS) device. An MIS device as set forth in FIG. 5D can feature a reduced Schottky Barrier height (SBH) and hence reduced contact resistance.

In reference to FIGS. 3A-3C, 4A-4C and 5A-5D a contact formation can be formed using a method as set forth in FIGS. 1A and 1B. In one aspect the method can include multiple annealing stages. In a first annealing, Ni can be targeted. Ni can be targeted using an annealing temperature that is high enough to trigger Ni-silicide formation, but lower than a temperature that triggers formation of Ti-silicide. Thus, during Ni-silicide formation, Ti-silicide formation can be avoided. In a second annealing, Ti can be targeted. Ti can be targeted using an annealing temperature that is high enough to trigger Ti-silicide or TiN formation. An optional third annealing can be performed for lowering resistance of a formed multiple layered contact interface formation.

Illustrated with reference to the methods of FIGS. 4A-4C and FIGS. 5A-5D, ordering of layers in a contact formation can be controlled using implantations, e.g., Si and or N implantation. In methods set forth herein silicide formation can be mediated with use of a metal. Use of metal to mediate silicide formation can provide various advantages. For example, use of a metal to mediate formation of silicide can reduce a formation temperature for the silicide. Reduction of silicide formation temperature can be particularly important given that a presence of a trench defined, by contact holes 72 in which a contact interface formation can be formed tends to increase a formation temperature.

There is set forth herein a semiconductor structure having a contact interface formation. The contact interface formation can be a multiple layer silicide formation. The contact interface formation can be a multiple layer formation having a single layer of silicide. A method as set forth herein can use multiple step annealing. A method as set forth herein can use multiple step reactive thermal annealing (RTA).

The multiple step RTA can be from low to high temperature. A second annealing can be at a higher temperature than a first annealing and a third annealing can be at a higher temperature than a first annealing.

Referring again to the flow diagram of FIG. 1B, in reference to an annealing time for a first annealing (block 24) second annealing (block 28) and a third annealing (block 32), an annealing time can be inversely proportional to annealing temperature. In one embodiment, an annealing time at block 24, 28 or 32 can be an annealing time of between 20 s and 60 s.

A contact interface formation herein in one embodiment can include a reacted Ti layer over a reacted Ni layer. Such silicide formation can include, e.g., Ti-silicide over Ni-silicide. A silicide formation including a reacted Ti layer over a reacted Ni layer can be well adapted for use with a p type S/D region 56. More particularly for a p type drain S/D region 56 Ni-silicide can have a lower energy Schottky barrier height than Ti-silicide. Accordingly for a p type drain S/D region, a Ti-silicide over Ni-silicide contact interface formation can provide a reduced energy Schottky barrier height.

A contact interface formation herein in one embodiment can include a reacted Ni layer over a reacted Ti layer. Such silicide formation can include, e.g., Ni-silicide over Ti-silicide, or Ni-silicide over TiN. A silicide formation including a reacted Ni layer over a reacted Ti layer can be well adapted for use with an a type S/D region 56. More particularly for an n type S/D region 56 Ti-silicide can have a lower energy Schottky barrier height than Ni-silicide. Accordingly for an a type S/D drain region 56 an Ni-silicide on Ti-silicide contact interface formation can provide a reduced energy Schottky barrier height.

Processes can be provided with or without selective Si and/or N implants to obtain any one of (a) a reacted Ni layer over reacted Ti layer or alternatively (b), a reacted Ti layer over reacted Ni layer silicide formation.

Use of a reacted Ti layer in a silicide formation can provide various advantages. In a formation including a reacted Ti layer, Si atoms can define a moving species. Accordingly, a reacted Ti layer can reduce encroachment from a metal contact layer into S/D region 56.

Methods set forth herein are easily integrated into semiconductor fabrication process flows. For example, in a typical method for formation or a contact, a Ti layer can be deposited over an SD region and can be subject to annealing for formation of a Ti-silicide followed by a deposition for defining of a remainder of a contact a metal layer (e.g. Tungsten) over a contact interface formation provided by a Ti-silicide.

With a method set forth herein, there may only be additional deposition of an Ni layer and an annealing process to form a Ti layer in reacted form and an Ni layer in reacted form. In one embodiment a method can include an implantation, e.g., using Si or N or both.

In one particular embodiment appropriate lithography processes are employed so that a configuration of a contact interface formation 174 varies throughout a semiconductor structure. Contact interface formation 174 can have a first configuration at a first location and a second configuration at a second location. Referring to FIG. 2, S/D region 56 at location A can be a p type region, and S/D region 56 at location B can be an n type region. In such embodiment, semiconductor structure 10 can be configured so that contact interface formation 174 at location A (p type) has an Ti-silicide over Ni-silicide configurations (more p compatible) and further so that contact interface formation 174 at location b (n type) has an Ni-silicide over Ti-silicide configuration (more n compatible).

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises," "has," "includes," or "contains" one or more steps or elements possesses those one or more steps or elements, but is not limited to possessing only those one or more steps or elements. Likewise, a step of a method or an element of a device that "comprises," "has," "includes," or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method of fabrication of a contact interface formation, the method comprising:
    depositing a layer of Ti in metal form over a source or drain region formed on a substrate;
    depositing a layer of Ni in metal form over the layer of Ti in metal form; and
    performing an annealing process of the deposited layer of Ti in metal form and the deposited layer of Ni in metal form to form the contact interface formation including Ni-silicide and Ti-silicide, the contact interface formation providing for an interface between the source or drain region and a contact, the annealing process comprising:
        performing a first annealing to form a layer of Ni-silicide from the deposited layer of Ni in metal form;
        performing a second annealing to lower a resistance of the layer of Ni-silicide and further to form a layer of Ti-silicide from the deposited layer of Ti in metal form; and
        performing a third annealing to lower a resistance the layer of Ti-silicide.

2. The method of claim 1, wherein the layer of Ti-silicide is formed over the layer of Ni-silicide.

3. The method of claim 1, wherein the layer of Ni-silicide is formed over the layer of Ti-silicide.

4. The method of claim 1, wherein the method further includes implanting of Si atoms at an interface of the deposited layer of Ti in metal form and the deposited layer of Ni in metal form prior to the annealing process.

5. The method of claim 1, wherein the second annealing is at a higher temperature than the first annealing.

6. The method of claim 1, wherein the third annealing is at a higher temperature than the second annealing.

7. The method of claim 1, wherein performing the first annealing to form the layer of Ni-silicide from the deposited layer of Ni in metal form comprises diffusing Ni atoms from the deposited layer of Ni in metal form into the substrate to form the layer of Ni-silicide.

8. The method of claim 7, wherein the substrate includes silicon, and wherein performing the second annealing to form a layer of Ti-silicide from the deposited layer of Ti in metal form comprises diffusing Si atoms from the substrate into the deposited layer of Ti in metal form to form a layer of Ti-silicide.

9. The method of claim 1, wherein the substrate includes silicon, and wherein performing the second annealing to form a layer of Ti-silicide from the deposited layer of Ti in metal form comprises diffusing Si atoms from the substrate into the deposited layer of Ti in metal form to form a layer of Ti-silicide.

10. A method of fabrication of a contact interface formation, the method comprising:
    depositing a layer of Ti in metal form over a source or drain region formed on a substrate;
    depositing a layer of Ni in metal form over the layer of Ti in metal form; and
    performing an annealing process of the deposited layer of Ti in metal form and the deposited layer of Ni in metal form to form the contact interface formation including Ni-silicide and Ti-nitride, the contact interface formation providing for an interface between the source or drain region and a contact, the annealing process comprising:
        performing a first annealing to form a layer of Ni-silicide from the deposited layer of Ni in metal form;
        performing a second annealing to lower a resistance of the layer of Ni-silicide and further to form a layer of Ti-nitride from the deposited layer of Ti in metal form; and
        performing a third annealing to lower a resistance of the layer of Ti-nitride.

11. The method of claim 10, wherein the method further includes implanting of N atoms at an interface of the deposited layer of Ti in metal form and the source or drain region on the substrate prior to the annealing process.

* * * * *